(12) United States Patent
Lin et al.

(10) Patent No.: US 11,968,869 B2
(45) Date of Patent: *Apr. 23, 2024

(54) TILED DEVICE AND ELECTRONIC DEVICE

(71) Applicant: InnoLux Corporation, Miao-Li County (TW)

(72) Inventors: Ya-Wen Lin, Miao-Li County (TW); Chien-Chih Chen, Miao-Li County (TW); Yen-Hsi Tu, Miao-Li County (TW); Cheng-Wei Chang, Miao-Li County (TW); Shu-Hui Yang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 78 days.

This patent is subject to a terminal disclaimer.

(21) Appl. No.: 17/732,500

(22) Filed: Apr. 28, 2022

(65) Prior Publication Data
US 2022/0254867 A1 Aug. 11, 2022

Related U.S. Application Data

(63) Continuation of application No. 16/656,537, filed on Oct. 17, 2019, now Pat. No. 11,348,993.
(Continued)

(30) Foreign Application Priority Data

May 29, 2019 (CN) .......................... 201910457824.4

(51) Int. Cl.
*H10K 59/18* (2023.01)
*H01L 23/498* (2006.01)
*H01L 27/15* (2006.01)
*H10K 77/10* (2023.01)
*H10K 102/00* (2023.01)

(52) U.S. Cl.
CPC .......... *H10K 59/18* (2023.02); *H01L 23/4985* (2013.01); *H01L 27/156* (2013.01); *H10K 77/111* (2023.02); *H10K 2102/311* (2023.02)

(58) Field of Classification Search
CPC ............. H01L 51/0097; H01L 27/3276; H01L 27/3293; H01L 23/4985; H01L 27/156; H10K 59/18; H10K 77/111
See application file for complete search history.

(56) References Cited

U.S. PATENT DOCUMENTS 11,348,993 B2 * 5/2022 Lin ........................ H01L 33/62

FOREIGN PATENT DOCUMENTS

CN 106298620 A * 1/2017 ........... G02F 1/1333

OTHER PUBLICATIONS

Machine Translation of CN-106298620-A, 2017.*

* cited by examiner

*Primary Examiner* — Suberr L Chi
(74) *Attorney, Agent, or Firm* — Winston Hsu

(57) ABSTRACT

An electronic device includes a flexible substrate and a conductive wire. The conductive wire is disposed on the flexible substrate and includes a metal portion and a plurality of openings disposed in the metal portion. The metal portion includes a plurality of extending portions and a plurality of joint portions, and each of the openings is surrounded by two of the plurality of extending portions and two of the plurality of joint portions. A ratio of a sum of widths of the plurality of extending portions to a sum of widths of the plurality of joint portions is in a range from 0.8 to 1.2.

6 Claims, 7 Drawing Sheets

Related U.S. Application Data

(60) Provisional application No. 62/769,025, filed on Nov. 19, 2018.

TILED DEVICE AND ELECTRONIC DEVICE

CROSS REFERENCE TO RELATED APPLICATIONS

This application is a continuation application of U.S. application Ser. No. 16/656,537, filed on Oct. 17, 2019, which claims the benefit of U.S. Provisional Application No. 62/769,025, filed on Nov. 19, 2018. The contents of these applications are incorporated herein by reference.

BACKGROUND OF THE DISCLOSURE

1. Field of the Disclosure

The present disclosure is related to a tiled device and an electronic device, and more particularly, to a tiled device and an electronic device including flexible substrates.

2. Description of the Prior Art

Electronic devices usually include displays to provide information to users in these days. In large-sized electronic devices, such as public information displays (PID), the technology of connecting multiple displays may be required. In order to improve the display quality of large-sized electronic devices, conductive wires in the electronic device may be bent to the rear side of the electronic device to minimize the gaps between adjoining displays. However, in some circumstances, the conductive wires may be damaged while bending, thus lowering the reliability or qualification rate of the electronic device.

SUMMARY OF THE DISCLOSURE

To solve the above technical problem, one of the objectives of the present disclosure is to provide an electronic device, including a flexible substrate and a conductive wire. The conductive wire is disposed on the flexible substrate and includes a metal portion and a plurality of openings disposed in the metal portion. The metal portion includes a plurality of extending portions and a plurality of joint portions, and each of the openings is surrounded by two of the plurality of extending portions and two of the plurality of joint portions. A ratio of a sum of widths of the plurality of extending portions to a sum of widths of the plurality of joint portions is in a range from 0.8 to 1.2.

The present disclosure also provides a tiled device, including a plurality of displays, each of the displays including a flexible substrate and a conductive wire. The flexible substrate includes a first bending region and a side region connected to the first bending region. The conductive wire is disposed on the flexible substrate and includes a metal portion and a plurality of openings disposed in the metal portion. A ratio of a total width of the metal portion disposed in the first bending region to a total width of the metal portion disposed in the side region is in a range from 0.8 to 1.2.

The present disclosure also provides an electronic device, including a flexible substrate and a conductive wire. The flexible substrate includes a first bending region and a side region connected to the first bending region. The conductive wire is disposed on the flexible substrate and includes a metal portion and a plurality of openings disposed in the metal portion. A ratio of a total width of the metal portion disposed in the first bending region to a total width of the metal portion disposed in the side region is in a range from 0.8 to 1.2, and a length of one of the openings in the first bending region is less than or equal to a length of one of the openings in the side region.

These and other objectives of the present disclosure will no doubt become obvious to those of ordinary skill in the art after reading the following detailed description of the embodiment that is illustrated in the various figures and drawings.

DETAILED DESCRIPTION

Figure 1:
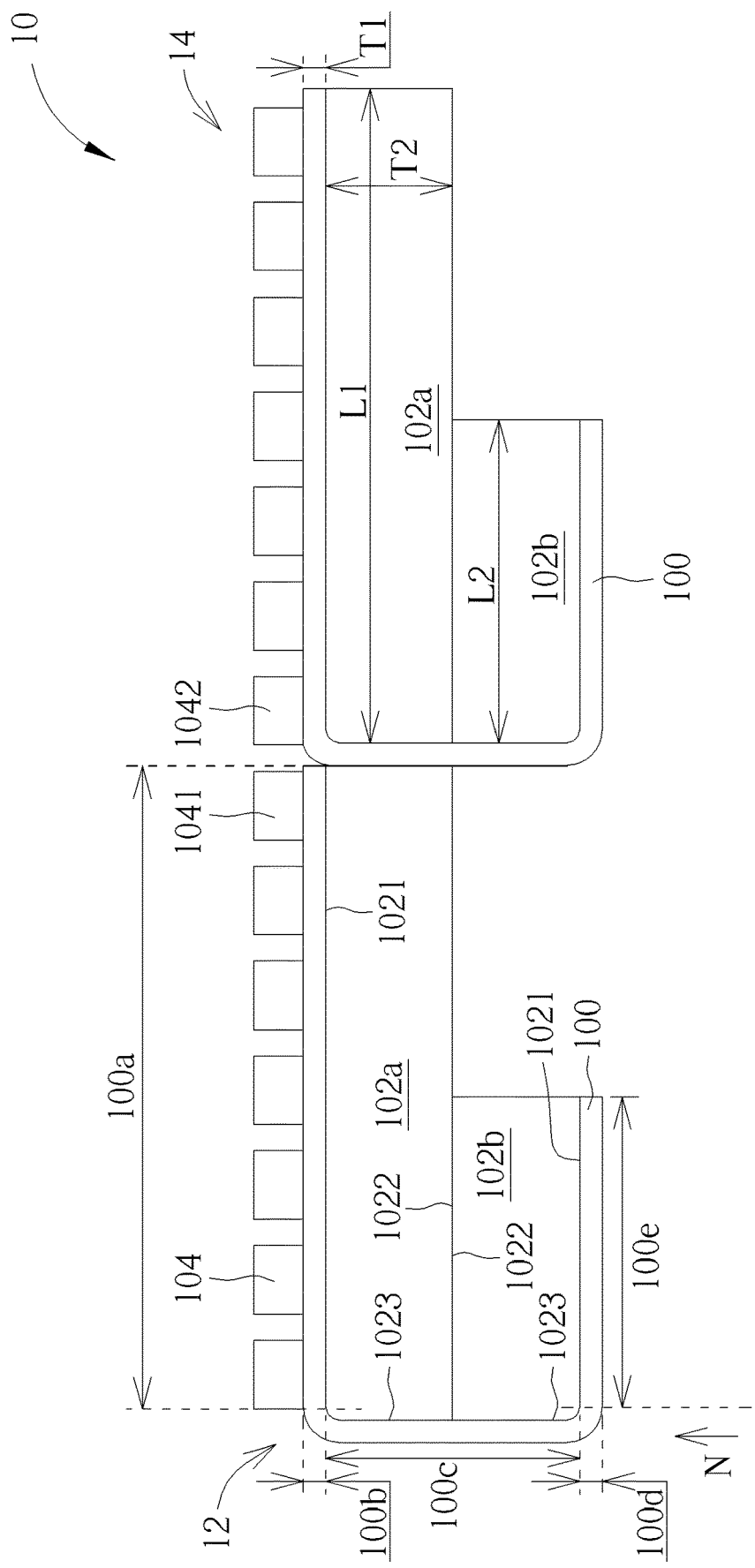
FIG. 1 is a side-view schematic diagram illustrating a tiled device or an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of an electronic device or a tiled device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The term "about", "substantially", "equal", or "same" generally refers to falling within 20% of a given value or range, or to falling within 10%, 5%, 3%, 2%, 1%, or 0.5% of a given value or range.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

An electronic device of the present disclosure may include a display device, an antenna device, or a tiled device, but not limited thereto. The electronic device may be a bendable or flexible electronic device. The electronic device may include light emitting diodes (LED) for example. The light emitting diodes may include, for example, organic light emitting diodes (OLED), mini LEDs, micro LEDs, or quantum dot light emitting diodes (QLED), or combinations thereof, but not limited thereto. The antenna device may include a liquid crystal antenna for example, but not limited thereto. The tiled device may include, for example, a display tiled device, an antenna tiled device, or the combination thereof, but not limited thereto. It should be noted that the electronic device may be any combination of the above devices, but not limited thereto. The display device is used as the electronic device or the tiled device to illustrate the present disclosure hereinafter, but the present disclosure is not limited thereto.

Figure 2:
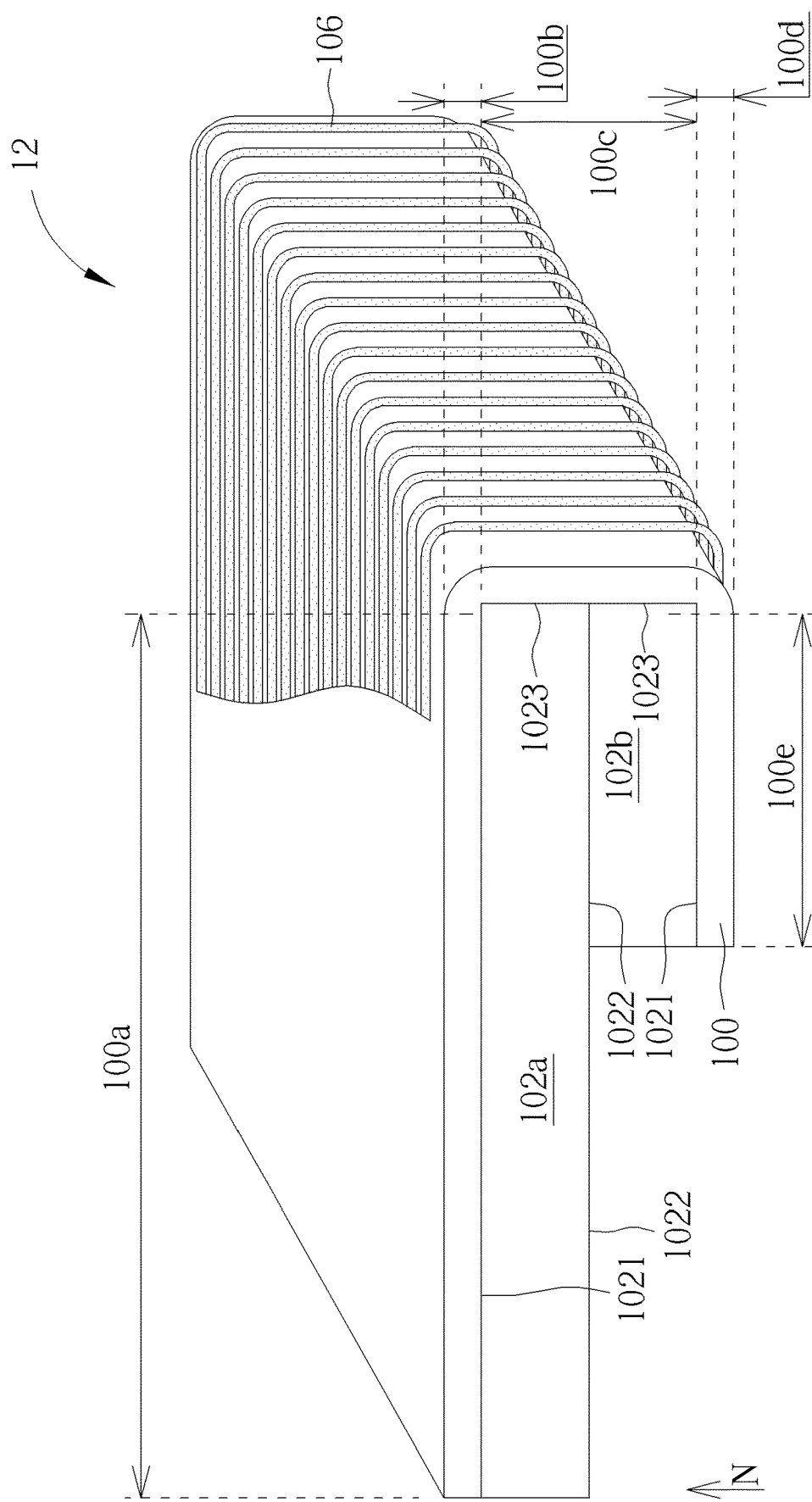
FIG. 2 is a partial side-view schematic diagram illustrating the curved electronic device according to the first embodiment of the present disclosure.

Referring to FIG. 1 and FIG. 2, FIG. 1 is a side-view schematic diagram illustrating a tiled device or an electronic device according to a first embodiment of the present disclosure, and FIG. 2 is a partial side-view schematic diagram illustrating the curved electronic device according to the first embodiment of the present disclosure. In some embodiments, the electronic device 10 may be a tiled device including a plurality of displays. For example, the electronic device 10 (or the tiled device) may include a display 12 and a display 14 connected to the display 14, but not limited thereto. The number of the displays connected to each other in the tiled device is not limited to FIG. 1. In some embodiments, the electronic device 10 may not be the tiled display device and include an individual display (such as the display 12 in FIG. 2), but not limited thereto.

Taking the display 12 as an example, as shown in FIG. 1 and FIG. 2, the electronic device 10 (when the electronic device 10 includes an individual display) or each of the displays (such as the display 12) in the tiled device may include a flexible substrate 100, a carrier 102a, and a carrier 102b, and the flexible substrate 100 may be disposed on front surfaces 1021 of the carrier 102a and the carrier 102b. A rear surface 1022 of the carrier 102a and a rear surface 1022 of the carrier 102b may be contacted to each other after the display 12 is bent, and the flexible substrate 100 may be disposed on the outer sides of the carrier 102a and the carrier 102b. For example, the carrier 102a and the carrier 102b may be disposed between two portions of the flexible substrate 100 in a projection direction N, but not limited thereto. In addition, the flexible substrate 100 may be disposed on side surfaces 1023 of the carrier 102a and the carrier 102b after the display 12 is bent, but not limited thereto. The length of the carrier 102a may be greater than the length of the carrier 102b, but not limited thereto. The material of the flexible substrate 100 may include polyimide (PI) or other suitable materials, but not limited thereto. The carrier 102a and the carrier 102b may include rigid substrates, and the material may include glass or PET, but not limited thereto.

The flexible substrate 100 may include a first main region 100a, a first bending region 100b, a side region 100c, a second bending region 100d, and a second main region 100e after the flexible substrate 100 is bent, but not limited thereto. The side region 100c is disposed between the first bending region 100b and the second bending region 100d, and the side region 100c is connected to the first bending region 100b and the second bending region 100d. The first bending region 100b, the side region 100c, and the second bending region 100d may be regarded as a folding region of the flexible substrate 100. The first bending region 100b is disposed between the first main region 100a and the side region 100c, and the first bending region 100b is connected to the first main region 100a and the side region 100c. The second bending region 100d is disposed between the side region 100c and the second main region 100e, and the second bending region 100d is connected to the second main region 100e and the side region 100c.

In addition, the electronic device may include at least one operating unit and/or at least one integrated circuit disposed in the main region of the flexible substrate 100. The at least one operating unit may include at least one light emitting unit and/or at least one antenna unit, but not limited thereto. For example, the operating units may be light emitting units. As shown in FIG. 1, the display 12 may include at least one light emitting unit 104 disposed in the first main region 100a of the flexible substrate 100, and the display 12 may include at least one integrated circuit (not shown) disposed in the second main region 100e of the flexible substrate 100. In some embodiments, the first main region 100a may be an operating region, and the first bending region 100b, the side region 100c, the second bending region 100d, and the second main region 100e may be a non-operating region for example, but not limited thereto. In some embodiments, the operating region may be a display region, and the non-operating region may be a peripheral region or traces region for example, but not limited thereto. Other layers or components, such as inorganic or organic insulating layers, conductive layers, thin film transistors, etc., may be disposed between the light emitting units 104 and the flexible substrate 100, but not limited thereto. Additionally, the light emitting units 104 may include mini LEDs, micro LEDs, OLEDs, quantum dot light emitting diodes (QLED), or combinations thereof, but not limited thereto. The light emitting units 104 may also include different types of display mediums, such as liquid crystal, quantum dots, phosphors, fluorescence materials, or combinations thereof, but not limited thereto. The integrated circuit may include at least one thin film transistor used for driving the light emitting units 104, but not limited thereto. In some embodiments, the integrated circuit may be a portion of the flexible printed circuit board, or the circuit may be directly formed on the flexible substrate or the flexible printed circuit board for example, but not limited thereto.

In some embodiments, the electronic device may include at least one antenna unit disposed in the first main region 100a of the flexible substrate 100, and the electronic device may include at least one integrated circuit disposed in the second main region 100e of the flexible substrate 100, but not limited thereto.

In the tiled device (as shown in FIG. 1), the distance between two adjacent light emitting units of the display 12 and the display 14 (such as a light emitting unit 1041 of the display 12 and a light emitting unit 1042 of the display 14) may be less than the distance between two adjacent light emitting units 104 in the display 12 or the display 14, thereby preventing the user from observing the gap between the display 12 and the display 14. In another aspect, the bending angles (or radii of curvature) of the first bending region 100b and/or the second bending region 100d may be reduced, and the smaller bending angles can reduce the gap between the display 12 and the display 14.

As shown in FIG. 2, the display 12 (or the electronic device 10) may include one or more conductive wires 106 disposed on the flexible substrate 100. For example, the conductive wires 106 may extend from the first main region 100a to the second main region 100e through the first bending region 100b, the side region 100c, and the second bending region 100d in sequence, and the conductive wires 106 may be bent with the flexible substrate 100, but not limited thereto. In some embodiments, the conductive wires 106 may be connected to the light emitting units 104 in the first main region 100a and the integrated circuit in the second main region 100e, but not limited thereto.

Figure 3:
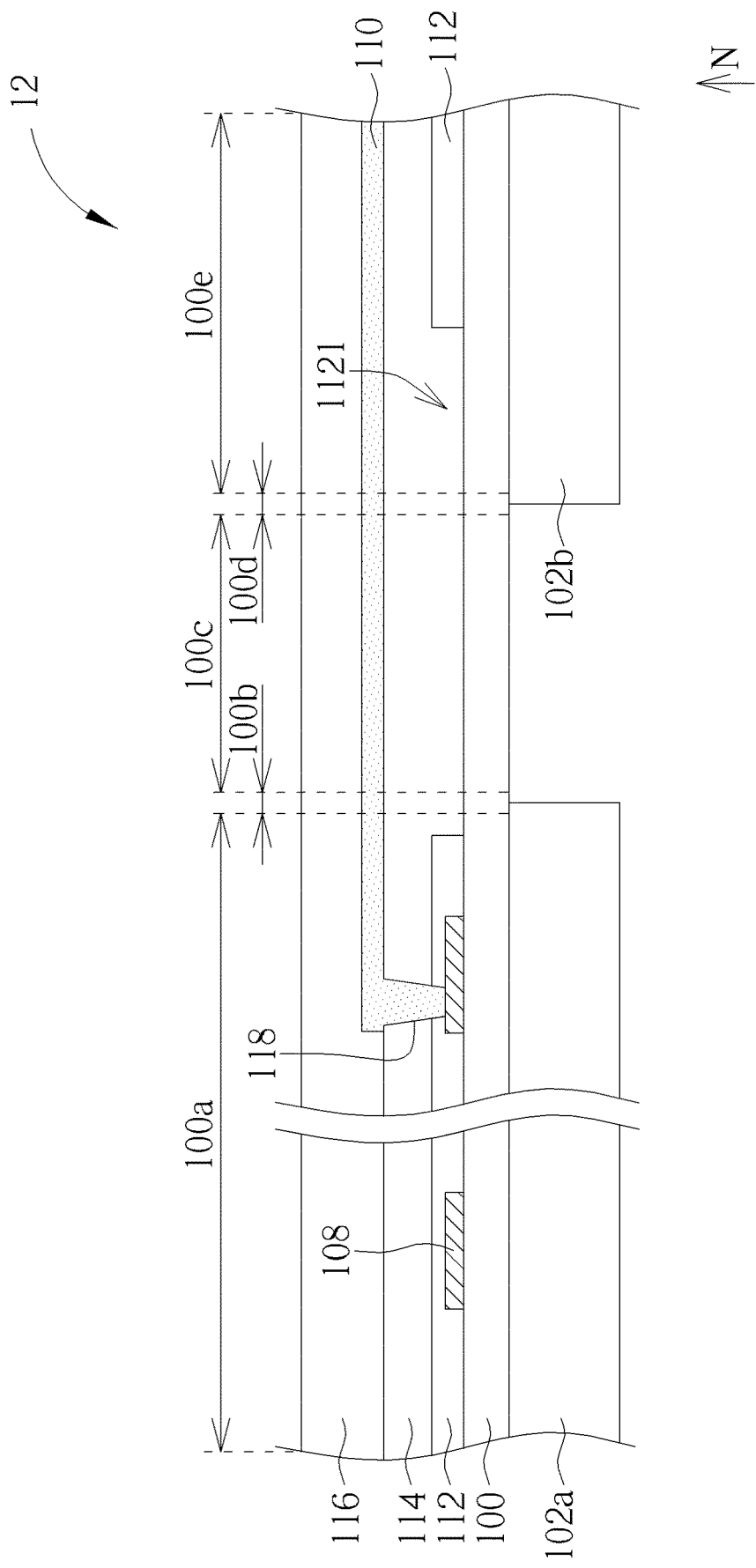
FIG. 3 is a partial side-view schematic diagram illustrating the unfolded electronic device according to the first embodiment of the present disclosure.

Referring to FIG. 3, it is a partial side-view schematic diagram illustrating the unfolded electronic device according to the first embodiment of the present disclosure. The display 12 (or the electronic device 10) may include a plurality of insulating layers and a plurality of conductive layers disposed on the flexible substrate 100. For example, as shown in FIG. 3, the display 12 may include a first conductive layer 108, a second conductive layer 110, a first insulating layer 112, a second insulating layer 114, and a third insulating layer 116 disposed on the flexible substrate 100, but not limited thereto. The first conductive layer 108 may be disposed on the flexible substrate 100 and in the first main region 100a. The first insulating layer 112 may be disposed on the flexible substrate 100 and cover the first conductive layer 108. In addition, the first insulating layer 112 may be disposed in the first main region 100a and the second main region 100e, and may not be disposed in the first bending region 100b, the side region 100c, and the second bending region 100d. Additionally, a recess 1121 may be formed between a portion of the first insulating layer 112 in the first main region 100a and another portion of the first insulating layer 112 in the second main region 100e, but not limited thereto. For example, the first insulating layer 112 may include the inorganic insulating material, but not limited thereto. Since the inorganic insulating material is brittle, the first insulating layer 112 can be prevented from being disposed at the bending portion (such as the first bending region 100b, the side region 100c, and the second bending region 100d) in the display 12 to improve the reliability of the display 12. In some embodiments, other layers may be disposed between the first conductive layer 108 and the flexible substrate 100 or between the first insulating layer 112 and the flexible substrate 100.

The second insulating layer 114 may be disposed on the first insulating layer 112 and filled into the recess 1121. For example, the second insulating layer 114 may include the organic insulating material, but not limited thereto. Since the organic insulating material is more flexible than the inorganic insulating material, the second insulating layer 114 may be disposed at the bending portion in the display 12. The second conductive layer 110 may be disposed on the second insulating layer 114.

The lamination structure in FIG. 3 is only an example, in some embodiments (referring to FIG. 3 and FIG. 4), the conductive wires 106 may be formed by the second conductive layer 110, but not limited thereto. The conductive wires 106 may also be formed by any conductive layer in the display 12 (or the electronic device 10) according to design requirements. The second conductive layer 110 may extend from the first main region 100a to the second main region 100e through the first bending region 100b, the side region 100c, and the second bending region 100d in sequence, or may selectively distribute in some of the regions, but not limited thereto. In addition, the second conductive layer 110 may be electrically connected to the first conductive layer 108 through a contact hole 118. For example, the first conductive layer 108 may include an electrode of the thin film transistor, and the thin film transistor may be electrically connected to the integrated circuit in the second bending region 100d through the conductive wire 106 (the second conductive layer 110), but not limited thereto. The first conductive layer 108 and the second conductive layer 110 may include metallic layers or other suitable conductive materials, and the first conductive layer 108 and the second conductive layer 110 may also include stacking conductive layers with multiple metallic layers, but not limited thereto.

The third insulating layer 116 may be disposed on the second conductive layer 110. For example, the third insulating layer 116 may include the organic insulating material, and the thickness of the third insulating layer 116 may be greater than the thickness of the first insulating layer 112 or the second insulating layer 114, but not limited thereto. For example, the second insulating layer 114 and the third insulating layer 116 may be used as planarization layers, but not limited thereto. In addition, the light emitting units 104 may be disposed on the third insulating layer 116 and in the first main region 100a, but not limited thereto.

For example, the thin film transistors may be disposed on the flexible substrate 100, and a semiconductor layer of the thin film transistor may include amorphous silicon, polysilicon, or oxide semiconductor, but not limited thereto. The polysilicon may include the low-temperature polysilicon, but not limited thereto. The oxide semiconductor may include indium gallium zinc oxide, but not limited thereto.

Figure 4:
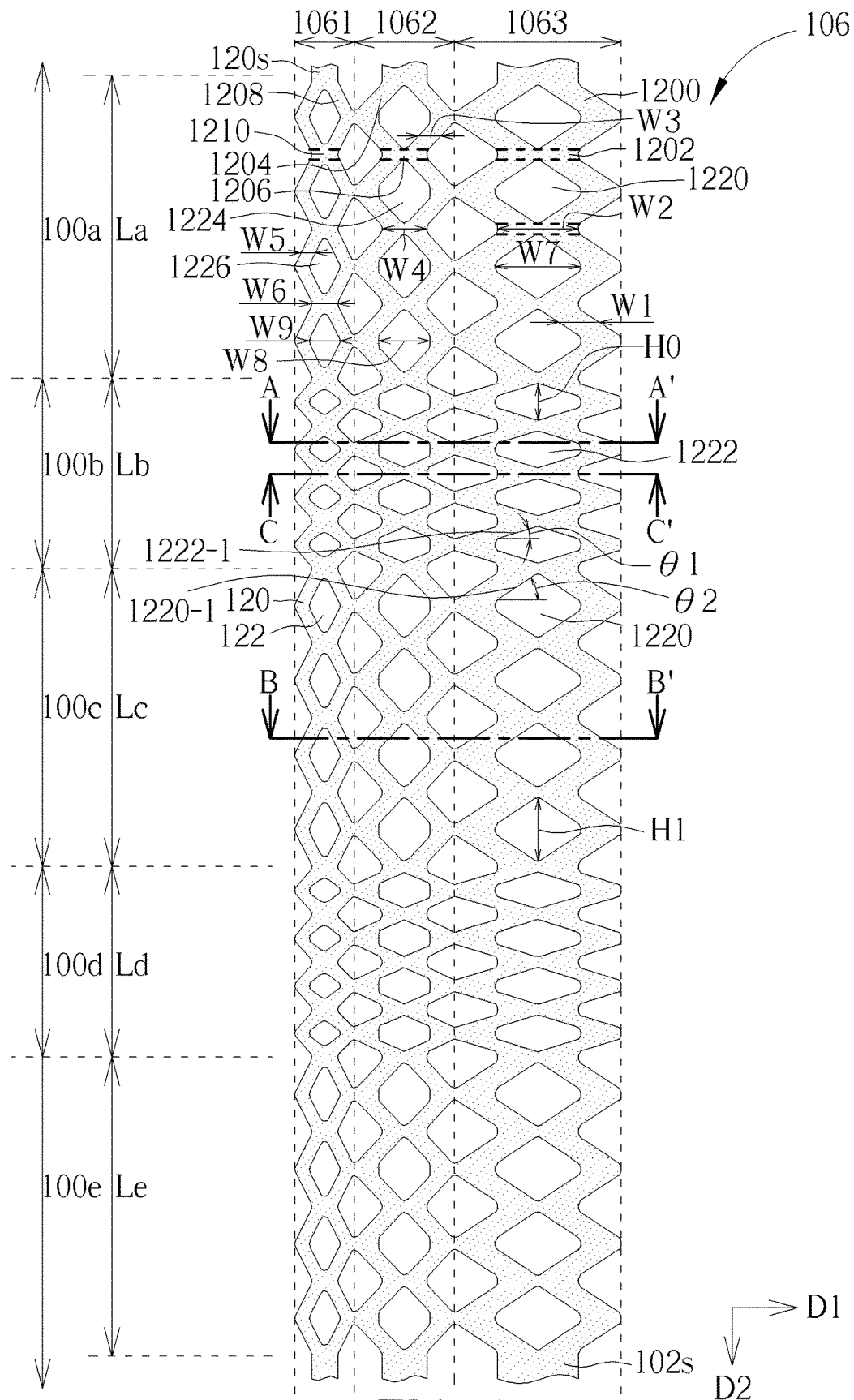
FIG. 4 is a top view schematic diagram illustrating a structure of a conductive wire according to the first embodiment of the present disclosure.

The pattern structure of the conductive wires 106 in the projection direction N (top view direction) of a portion of the unfolded electronic device is detailed hereinafter. Referring to FIG. 4, it is a top view schematic diagram illustrating a structure of a conductive wire according to the first embodiment of the present disclosure. One of the conductive wires 106 may include a metal portion 120 and a plurality of openings 122, the openings 122 may be disposed corresponding to the metal portion 120. In an embodiment, the openings 122 may be disposed in the metal portion 120, as shown in FIG. 4. In some embodiments, the conductive wire 106 may include a sub-structure 1061, a sub-structure 1062, and a sub-structure 1063 in a first direction D1, but the arrangement or number of the sub-structures in the conductive wire 106 may be adjusted according to requirements. Taking the sub-structure 1063 as an example, the sub-structure 1063 may include a metal line having the chain structure and extending along a second direction D2, and the first direction D1 may be perpendicular to the second direction D2, but not limited thereto. The sub-structure 1063 may include a plurality of openings 1220 and a plurality of openings 1222 arranged along the second direction D2, and a portion of the metal portion 120 disposed in the sub-structure 1063 may surround the openings 1220 and the openings 1222 and extend along the second direction D2. Each of the openings 1220 or each of the openings 1222 may be surrounded by two extending portions 1200 and two joint portions 1202 in the metal portion 120. For example, the extending portion 1200 may be the metal line segment, and the joint portion 1202 may be the joint of different metal line segments, but not limited thereto. The sizes of the opening 1220 and the opening 1222 are different, and this feature will be described later.

In the sub-structure 1063, the widths W1 of the extending portions 1200 may be substantially equal, the widths W2 of the joint portions 1202 may be substantially equal, and the width W2 may be substantially twice the width W1, but not limited thereto. The width of the extending portion mentioned herein may refer to the width of the metal line segment, and the width of the joint portion may refer to the width of the joint of the metal line segments, but not limited thereto. As used herein, the "width" may be measured along a direction perpendicular to the extending direction of the conductive wire (e.g., the first direction D1 in FIG. 4) in the region where the object is located, and the "length" may be measured along a direction parallel to the extending direction of the conductive wire (e.g., the second direction D2 in FIG. 4) in the region where the object is located. In addition, the sub-structure 1061 and the sub-structure 1062 may also have the same characteristics as the sub-structure 1063 described above and will not be redundantly described.

As shown in FIG. 4, the sub-structure 1062 may be disposed between the sub-structure 1061 and the sub-structure 1063 in the first direction D1. The sub-structure 1062 may be connected to the sub-structure 1061 and the sub-structure 1063. For example, the extending portions 1204 at one side of the sub-structure 1062 may be connected to the extending portions 1200 of the adjacent sub-structure 1063, and the extending portions 1204 at the other side of the sub-structure 1062 may be connected to the extending portions 1208 of the adjacent sub-structure 1061.

In addition, in the sub-structure 1062, each of the extending portions 1204 has a width W3, each of the joint portions 1206 has a width W4. In some embodiments (as shown in FIG. 4), the width W1 may be greater than the width W3, and the width W2 may be greater than the width W4, but not limited thereto. In the sub-structure 1061, each of the extending portions 1208 has a width W5, each of the joint portions 1210 has a width W6. In some embodiments (shown in FIG. 4), the width W3 may be greater than the width W5, and the width W4 may be greater than the width W6, but not limited thereto. Additionally, the width of one of the openings 1220 in the sub-structure 1063, the width of one of the openings 1224 in the sub-structure 1062, and the width of one of the openings 1226 in the sub-structure 1061 may be different. For example, each of the openings 1220 in the sub-structure 1063 may have a width W7, each of the openings 1224 in the sub-structure 1062 may have a width W8, each of the openings 1226 in the sub-structure 1061 may have a width W9, the width W7 may be greater than the width W8, and the width W8 may be greater than the width W9, but not limited thereto. The widths mentioned above are measured in the first direction D1 (the direction perpendicular to the extending direction of the conductive wire 106). In some embodiments, the widths of the extending portions, joint portions, and/or openings in different sub-structures may also be substantially equal to each other. For example, the conductive wire 106 may include one or more sub-structures 1061, one or more sub-structures 1062, or one or more sub-structures 1063 in the first direction D1.

In any two different regions of the first main region 100a, the first bending region 100b, the side region 100c, the second bending region 100d, and the second main region 100e in the second direction D2, a ratio of total widths of the metal portion 120 in two different regions of the conductive wire 106 measured in the first direction D1 may be in a range from 0.8 to 1.2. As shown in FIG. 4, a total width WT1 of the metal portion 120 in the first bending region 100b measured along the line A-A' and along the first direction D1 may be 2*W1+2*W3+2*W5 for example. The total width of the metal portion may be the sum of the widths of the metal line segments (e.g., extending portions) and/or the joints of metal line segments (e.g., joint portions) which the line A-A' passes, but not limited thereto. In the side region 100c, a total width WT2 of the metal portion 120 measured along the line B-B' and along the first direction D1 may also be 2*W1+2*W3+2*W5 for example. A ratio (WT1/WT2) of the total width WT1 of the metal portion 120 disposed in the first bending region 100b to the total width WT2 of the metal portion 120 disposed in the side region 100c may be in a range from 0.8 to 1.2 (0.8≤WT1/WT2≤1.2). Similarly, a ratio (WT3/WT2) of a total width WT3 of the metal portion 120 disposed in the second bending region 100d to the total width WT2 of the metal portion 120 disposed in the side region 100c may be in a range from 0.8 to 1.2 (0.8≤WT3/WT2≤1.2). In addition, a ratio (WT4/WT1) of a total width WT4 of the metal portion 120 disposed in the first main region 100a or the second main region 100e to the total width WT1 of the metal portion 120 disposed in the first bending region 100b may be in a range from 0.8 to 1.2 (0.8≤WT4/WT1≤1.2). It should be noted that the ratio of the total widths of the metal portion in different regions mentioned above may be, for example, the ratio of the sums of widths of the extending portions in two regions, the ratio of the sums of widths of the joint portions in two regions, or the ratio of the sums of widths of the metal line segments and the joints in two regions, but not limited thereto.

In another aspect, at different locations in any one of the first main region 100a, the first bending region 100b, the side region 100c, the second bending region 100d, and the second main region 100e in the second direction D2, the ratio of the total widths of the metal portion 120 measured in the first direction D1 may be in the range from 0.8 to 1.2. The total width of the metal portion may be the sum of the widths of the metal line segments (e.g., extending portions) and/or the joints of metal line segments (e.g., joint portions) which the measurement line (e.g., line A-A') passes, but not limited thereto. For example, as shown in FIG. 4, the total width WT1 of the metal portion 120 measured along the line A-A' and along the first direction D1 in the first bending region 100b may be 2*W1+2*W3+2*W5 for example. Also, in the first bending region 100b, a total width WT5 of the metal portion 120 measured along the line C-C' and along the first direction D1 may be W2+W4+W6 for example. A ratio (WT1/WT5) of the total width WT1 of the metal portion 120 to the total width WT5 of the metal portion 120 in the first bending region 100b may be in a range from 0.8 to 1.2 (0.8≤WT1/WT5≤1.2). The first bending region 100b is taken as an example in the above description. Additionally, the ratio of the total widths of the metal portion of the conductive wire 106 at different locations in the side region 100c, the second bending region 100d, or other regions may also be in the range from 0.8 to 1.2. It should be noted that the ratio of the total widths of the metal portion in the same region mentioned above may be, for example, the ratio of the sums of widths of the extending portions in the same region, the ratio of the sums of widths of the joint portions in the same region, or the ratio of the sums of widths of the metal line segments and the joints in the same region, but not limited thereto.

Therefore, the total width of the metal portion 120 of the conductive wire 106 in the direction perpendicular to the extending direction (e.g., the first direction D1) varies slightly between different regions or within the same region, so that the stress in the conductive wire 106 can be evenly distributed through the metal portion 120 during bending, thereby reducing the chance of fracture of the conductive wire 106.

In addition, the structure of the metal portion 120 in different regions of the conductive wire 106 corresponding to different regions of the flexible substrate 100 may have different densities. Taking the sub-structure 1063 as an example, as shown in FIG. 4, a length H0 of one of the openings 1222 in the first bending region 100b and/or the second bending region 100d may be less than a length H1 of one of the openings 1220 in the first main region 100a, the side region 100c, and/or the second main region 100e. The length H0 and the length H1 may be substantially the maximum length of the opening in the second direction D2. A ratio of the length H0 to the length H1 (H0/H1) may be less than or equal to 0.9 and greater than or equal to 0.3. In another aspect, the lengths H0 and/or the lengths H1 of the openings of the sub-structure 1061, the sub-structure 1062, and the sub-structure 1063 in the same row along the first direction D1 may selectively be equal or unequal, but not limited thereto.

In addition, the structure of the metal portion 120 in different regions of the conductive wire 106 corresponding to different regions of the flexible substrate 100 may have substantially the same density. Referring to FIG. 4 and taking the sub-structure 1063 as an example, the length H1 of one of the openings 1222 in the first bending region 100b and/or the second bending region 100d may also equal to the length H0 of one of the openings 1220 in the first main region 100a, the side region 100c, and/or the second main region 100e. The length H0 and the length H1 may be substantially the maximum length of the opening in the second direction D2. The ratio (H0/H1) of the length H0 to the length H1 may be in a range from 0.95 to 1.05. In another aspect, the lengths H0 and/or the lengths H1 of the openings of the sub-structure 1061, the sub-structure 1062, and the sub-structure 1063 in the same row along the first direction D1 may selectively be equal or unequal, but not limited thereto.

Taking the sub-structure 1063 as an example, one of the openings 1222 in the first bending region 100b and/or the second bending region 100d includes a first included angle θ1, and the first included angle θ1 can be an acute angle included between a side 1222-1 of the opening 1222 and the first direction D1. One of the openings 1220 in the first main region 100a, the side region 100c, and/or the second main region 100e includes a second included angle θ2, the second included angle θ2 is an acute angle included between a side 1220-1 of the opening 1220 and the first direction D1, and the side 1222-1 of the opening 1222 corresponds to the side 1220-1 of the opening 1220. For example (referring to FIG. 4), the side 1222-1 may be located in the upper left region of the opening 1222, the side 1220-1 may also be located in the upper left region of the opening 1220 corresponding to the side 1222-1. A ratio of the first angle θ1 to the second angle θ2 (θ1/θ2) may be less than or equal to 0.9 and greater than or equal to 0.3. The first angle θ1 and the second angle θ2 may be angles included between the inclined sides of the extending portions 1200 and the first direction D1 (perpendicular to the extending direction of the conductive wire 106) for example. The sub-structure 1061 and the sub-structure 1062 may also have the same characteristics as the sub-structure 1063 described above and will not be redundantly described.

Therefore, the structure of the metal portion 120 in the regions of the conductive wire 106 corresponding to the first bending region 100b and/or the second bending region 100d of the flexible substrate 100 may have higher density, and the tensile resistance of the conductive wire 106 can be improved during bending. In some embodiments, the structure of the metal portion 120 with higher density may also be applied to the first main region 100a, the side region 100c, and/or the second main region 100e, but not limited thereto.

Referring to FIG. 4 and FIG. 1, a length La of the region of the conductive wire 106 having openings and corresponding to the first main region 100a of the flexible substrate 100 may be in a range of $0.2T2 \leq La \leq L1$, T2 is the thickness of the carrier 102a, and L1 is the length of the carrier 102a. A length Lc of the region of the conductive wire 106 having openings and corresponding to the side region 100c of the flexible substrate 100 may be in a range of $2(T1+T2) \leq Lc \leq L1$, and T1 is the thickness of the flexible substrate 100. A length Le of the region of the conductive wire 106 having openings and corresponding to the second main region 100e of the flexible substrate 100 may be in a range of $0.2T2 \leq Le \leq L2$, and L2 is the length of the carrier 102b. A length Lb or a length Ld of the region of the conductive wire 106 having openings and corresponding to the first bending region 100b or the second bending region 100d of the flexible substrate 100 may be in a range of $2(T1+T2) \leq Lb \leq L1$ or $2(T1+T2) \leq Ld \leq L1$. In addition, as shown in FIG. 4, the conductive wire 106 may also include a straight metal portion 120s without openings and connected to the metal portion 120 in the first main region 100a and/or the second main region 100e, but not limited thereto. In some embodiments, the openings may not be disposed in the conductive wire 106 in the first main region 100a and/or the second main region 100e.

Figure 5:
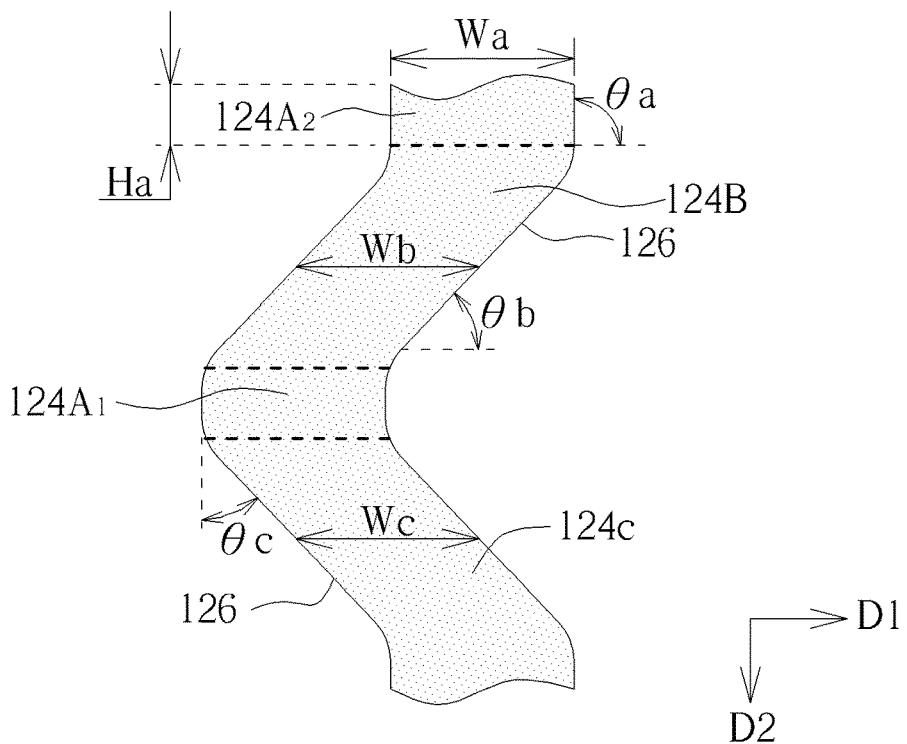
FIG. 5 is a partially enlarged schematic diagram illustrating the conductive wire according to the first embodiment of the present disclosure.

Referring to FIG. 5, it is a partially enlarged schematic diagram illustrating the conductive wire according to the first embodiment of the present disclosure. The structure shown in FIG. 5 may be the structure of a portion of the sub-structure 1061, the sub-structure 1062, or the sub-structure 1063. Taking a portion of the sub-structure 1063 as an example, a portion of the metal portion 120 in FIG. 5 may include two first segments $124A_1$ and $124A_2$, a second segment 124B, and a third segment 124C. The second segment 124B can be disposed between the first segment $124A_1$ and the first segment $124A_2$, and the first segment $124A_1$ can be disposed between the second segment 124B and the third segment 124C. For example, the first segment $124A_1$ and the first segment $124A_2$ may be rectangles, and the first segment $124A_2$ may be a portion of the joint portion 1202 in FIG. 4, but not limited thereto. The sides of the first segment $124A_1$ and the first segment $124A_2$ may be substantially parallel to the first direction D1 or the second direction D2 for example, and the sides of the segments may be slightly curved, but not limited thereto. The second segment 124B and the third segment 124C substantially may be parallelograms for example, and the sides or corners of the segments may be slightly curved. Some of the sides of the second segment 124B and the third segment 124C may be parallel to the first direction D1, and the second segment 124B and the third segment 124C may include inclined sides 126 that are not parallel to the first direction D1 nor the second direction D2.

An included angle θa may be included between the side of the first segment $124A_1$ and the first direction D1 or between the side of the first segment $124A_2$ and the first direction D1, an included angle θb may be included between the inclined side 126 of the second segment 124B and the first direction D1, and an included angle θc may be included between the inclined side 126 of the third segment 124C and the second direction D2. For example, a ratio (θb/θa) of the included angle θb to the included angle θa or a ratio (θc/θa) of the included angle θc to the included angle θa may be in a range from 0.01 to 0.99, but not limited thereto. For example, the included angle θa may be in a range from 80 degrees to 90 degrees, such as 85 degrees, but not limited thereto. For example, the included angle θb and the included angle θc may be in a range from 1 degree to 89 degrees, such as 30 degrees or 60 degrees, but not limited thereto.

In the first direction D1, the first segment $124A_1$ and the first segment $124A_2$ may have widths Wa, the second segment 124B may have a width Wb, and the third segment 124C may have a width Wc. A ratio (Wa/Wb) of the width Wa to the width Wb or a ratio (Wa/Wc) of the width Wa to the width Wc may be in a range from 0.9 to 1.1, but not limited thereto. For example, the width Wa may be in a range from 1 micrometer (um) to 15 um, such as 5 um, but not limited thereto. In addition, the first segment $124A_1$ and the first segment $124A_2$ may have heights Ha, a ratio (Ha/Wa) of the height Ha to the width Wa may be in a range from 0.2 to 1.5 (0.2≤Ha/Wa≤1.5), such as 0.5, 0.9, or 1.2, but not limited thereto.

Other embodiments of the present disclosure are detailed below. To simplify the description, identical components in each of the following embodiments are marked with identical symbols. For making it easier to compare the difference between the embodiments, the following description will detail the dissimilarities among different embodiments and the identical features will not be redundantly described.

Figure 6:
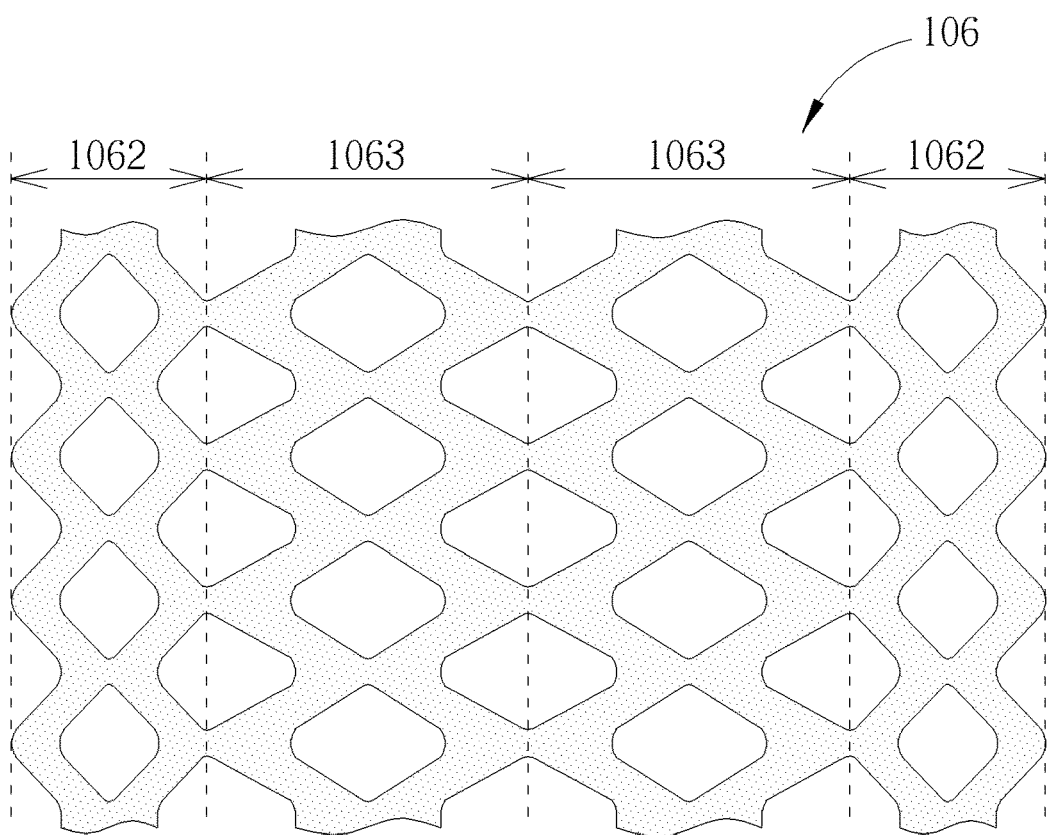
FIG. 6 is a top view schematic diagram illustrating a portion of a structure of a conductive wire according to a second embodiment of the present disclosure.

Referring to FIG. 6, it is a top view schematic diagram illustrating a portion of a structure of a conductive wire according to a second embodiment of the present disclosure. The difference between the first embodiment (shown in FIG. 4) and the second embodiment is that the conductive wire 106 of the second embodiment may include four sub-structures, such as two sub-structures 1062 and two sub-structures 1063. For example, the sub-structures 1063 may be disposed between two sub-structures 1062 in the first direction D1, the sub-structures 1062 and the sub-structures 1063 may be connected to each other, but the number or arrangement of the sub-structures is not limited thereto. Similar to the first embodiment, different regions of the structure of the metal portion 120 of the conductive wire 106 corresponding to different regions of the flexible substrate 100 may have different densities in this embodiment, and the side of the conductive wire and/or the opening may be curved to reduce the phenomenon of electrostatic accumulation or discharge.

Figure 9:
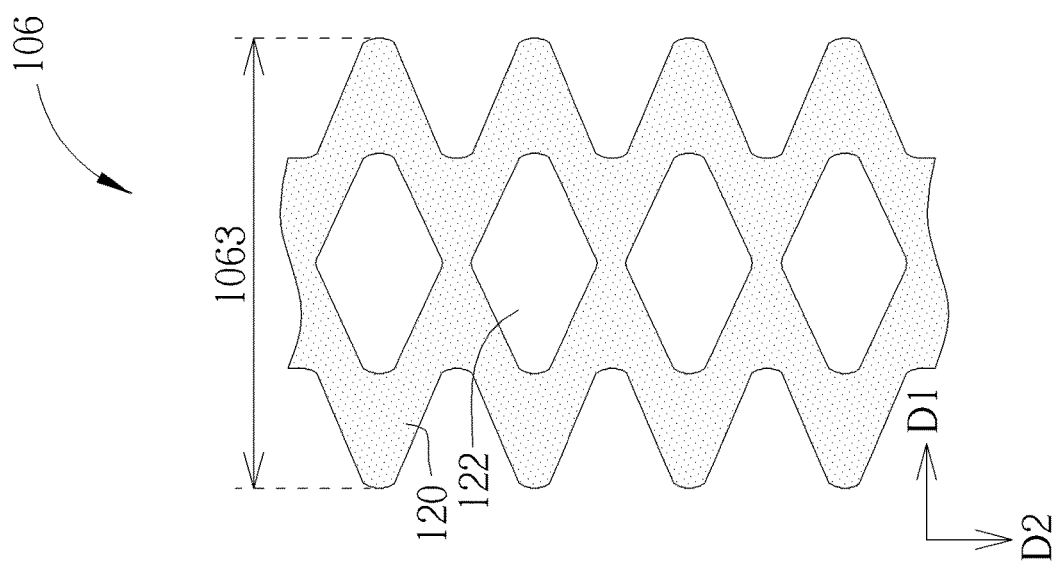
FIG. 9 is a top view schematic diagram illustrating a portion of a structure of a conductive wire according to a fifth embodiment of the present disclosure.
Figure 8:
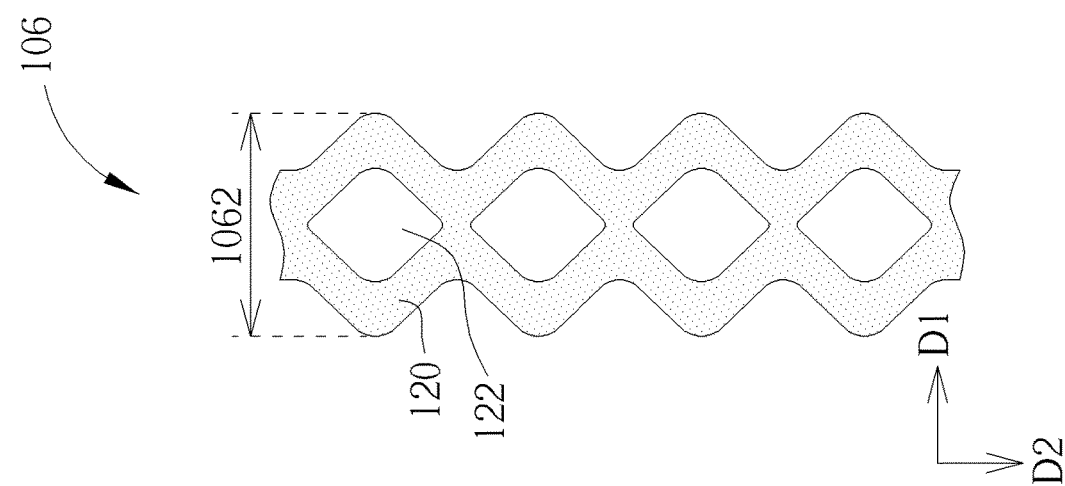
FIG. 8 is a top view schematic diagram illustrating a portion of a structure of a conductive wire according to a fourth embodiment of the present disclosure.
Figure 7:
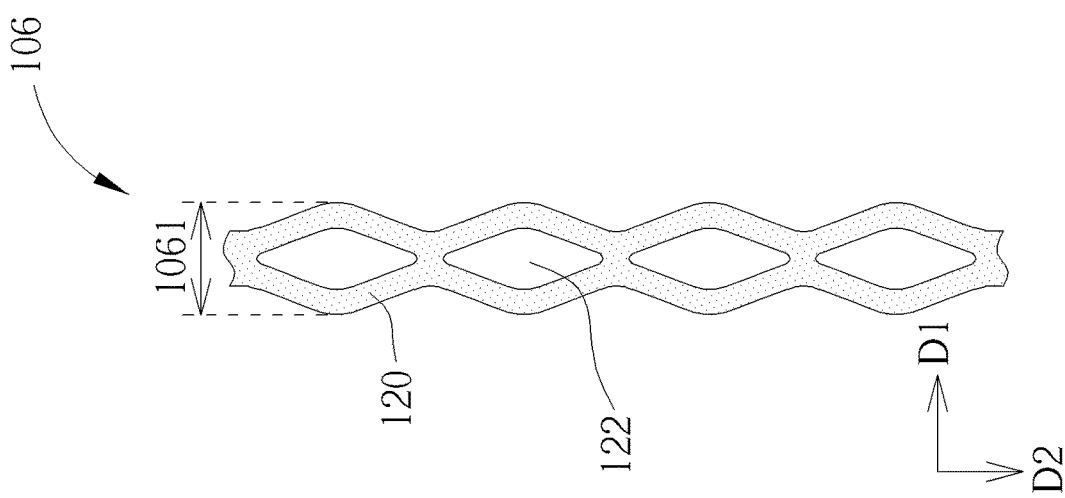
FIG. 7 is a top view schematic diagram illustrating a portion of a structure of a conductive wire according to a third embodiment of the present disclosure.

Referring to FIG. 7 to FIG. 9, FIG. 7 to FIG. 9 are top view schematic diagrams illustrating portions of structures of conductive wires according to a third embodiment to a fifth embodiment of the present disclosure. The difference between the third embodiment to the fifth embodiment and the first embodiment (shown in FIG. 4) is that the conductive wires 106 of the third embodiment to the fifth embodiment may include one sub-structure. As shown in FIG. 7 to FIG. 9, the conductive wire 106 may include one sub-structure 1061, one sub-structure 1062, or one sub-structure 1063. As described in the first embodiment, the widths of the metal portions 120 (such as the extending portions or the joint portions) in the sub-structure 1061, the sub-structure 1062, and the sub-structure 1063 may be different, or the widths of the openings 122 in the sub-structure 1061, the sub-structure 1062, and the sub-structure 1063 may be different. Similar to the first embodiment, different regions of the structure of the metal portion 120 of the conductive wire 106 corresponding to different regions of the flexible substrate 100 may have different densities in the third embodiment to the fifth embodiment.

Figure 10:
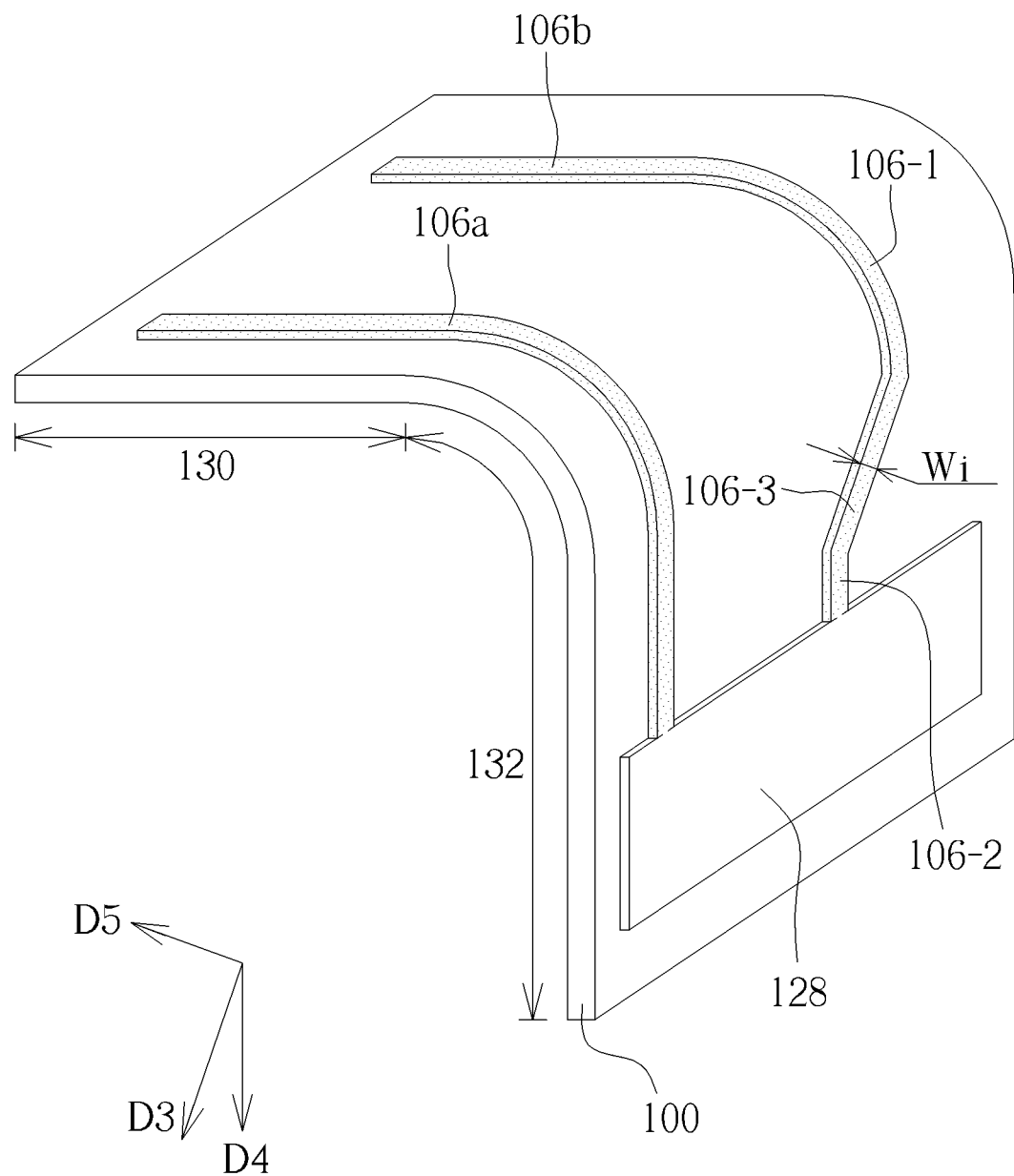
FIG. 10 is a schematic diagram illustrating an electronic device according to a sixth embodiment of the present disclosure.

Referring to FIG. 10, it is a schematic diagram illustrating an electronic device according to a sixth embodiment of the present disclosure. For purposes of illustrative clarity and being easily understood by the readers, FIG. 10 shows the flexible substrate 100 and the conductive wire 106a, the conductive wire 106b, and the integrated circuit 128 thereon, and omits the structures of the metal portions and openings in the conductive wires and the remaining components in the electronic device. As shown in FIG. 10, the conductive wire 106a and the conductive wire 106b may be extended from the operating region 130 to the non-operating region 132 and electrically connected to the integrated circuit 128, but not limited thereto. For example, the operating region 130 may be the first main region 100a in the above embodiments, and the non-operating region 132 may be the first bending region 100b, the side region 100c, the second bending region 100d, and the second main region 100e in the above embodiments, but not limited thereto. The extending direction of the conductive wire 106a extending from the operating region 130 to the non-operating region 132 may not be changed, while the extending direction of the conductive wire 106b may be changed in the non-operating region 132 (e.g., in the second main region 100e). The conductive wire 106b may include a first portion 106-1, a second portion 106-2, and a connecting portion 106-3, the connecting portion 106-3 is connected to the first portion 106-1 and the second portion 106-2, and the extending direction of the connecting portion 106-3 is different from the extending direction of the first portion 106-1 or the second portion 106-2. The connecting portion 106-3 may extend obliquely away from the side of the flexible substrate 100 in the non-operating region 132, allowing the conductive wires to be distributed more intensively. For example, the extending direction of the connecting portion 106-3 of the conductive wire 106b may be parallel to a third direction D3, the extending direction of the rest of the conductive wire 106b may be parallel to a fourth direction D4, and the third direction D3 and the fourth direction D4 are not parallel. The number of times or the location of the conductive wire 106b changing the extending direction is not limited to that shown in FIG. 10.

In addition, a total width Wi of the metal portion is measured along a fifth direction D5 perpendicular to the third direction D3 in the connecting portion 106-3 of the conductive wire 106b. In the method of measuring the total width of the metal portion of the conductive wire, the total width is measured along a direction perpendicular to the extending direction of the conductive wire in the region where the measurement is conducted. Additionally, the integrated circuit 128 in FIG. 10 may be bent to the rear side or below the operating region 130 of the flexible substrate 100, but not limited thereto.

To sum up, the conductive wires of the present disclosure include a plurality of openings, and such design can be applied in the curved electronic device (or the curved displays in the tiled device). The total width of the metal portion of the conductive wire varies slightly between different regions and/or in the same region in the electronic device, the ratio of the total widths of the metal portion between different regions and/or in the same region may be in the range from 0.8 to 1.2, and the total widths are measured along the direction perpendicular to the extending direction of the conductive wire. Therefore, the stress in the conductive wire can be evenly distributed through the metal portion during bending, thereby reducing the chance of fracture of the conductive wire. In addition, the structure of the metal portion of regions of the conductive wire corresponding to the first bending region and/or the second bending region of the flexible substrate may have higher density, and the tensile resistance of the conductive wire can be improved during bending.

The above description refers to embodiments of the present disclosure, and it is not intended to limit the present disclosure. For those skilled in the art, the present disclosure can be modified or adjusted. As long as the different features between the embodiments do not conflict or depart from the spirit of the present disclosure, they can be rearranged or combined arbitrarily according to the designs. Any modification, equivalent substitution, improvement, etc. made within the spirit or principles of the present disclosure shall be included within the scope of the present disclosure.

What is claimed is:

1. An electronic device, comprising:
   a flexible substrate; and
   a conductive wire, disposed on the flexible substrate and comprising a metal portion and a plurality of openings disposed in the metal portion,
   wherein the metal portion comprises a plurality of extending portions and a plurality of joint portions, and each of the openings is surrounded by two of the plurality of extending portions and two of the plurality of joint portions,
   wherein a ratio of a sum of widths of the plurality of extending portions to a sum of widths of the plurality of joint portions is in a range from 0.8 to 1.2.

2. The electronic device according to claim 1, wherein the flexible substrate further comprises an operating region, and a part of the plurality of openings is disposed in the operating region.

3. The electronic device according to claim 2, wherein the flexible substrate further comprises a first bending region connected to the operating region, and another part of the plurality of openings is disposed in the first bending region.

4. The electronic device according to claim 2, further comprising a light emitting unit and an integrated circuit, wherein the flexible substrate further comprises a main region, the integrated circuit is disposed in the main region, the light emitting unit is disposed in the operating region, and the conductive wire is electrically connected to the light emitting unit and the integrated circuit.

5. The electronic device according to claim 1, further comprising a first carrier and a second carrier, wherein the flexible substrate is disposed on the first carrier and the second carrier, and the first carrier is separated from the second carrier by a distance.

6. The electronic device according to claim 1, wherein the conductive wire further comprises a first portion, a second portion and a connecting portion, the connecting portion is disposed between the first portion and the second portion and connected to the first portion and the second portion, and an extending direction of the connecting portion is different from an extending direction of the first portion or an extending direction of the second portion.

* * * * *